(12) United States Patent
Rodriguez et al.

(10) Patent No.: US 9,879,846 B2
(45) Date of Patent: Jan. 30, 2018

(54) POWER CABLE WITH MOTION-ACTIVATED LIGHT

(71) Applicant: GOOGLE INC., Mountain View, CA (US)

(72) Inventors: Adam Rodriguez, San Francisco, CA (US); David Ness Schneider, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 35 days.

(21) Appl. No.: 15/240,474

(22) Filed: Aug. 18, 2016

(65) Prior Publication Data

US 2017/0051902 A1    Feb. 23, 2017

Related U.S. Application Data

(60) Provisional application No. 62/208,088, filed on Aug. 21, 2015.

(51) Int. Cl.
*F21V 33/00* (2006.01)
*F21V 23/00* (2015.01)
(Continued)

(52) U.S. Cl.
CPC ........ *F21V 23/003* (2013.01); *F21V 23/0464* (2013.01); *F21V 23/0492* (2013.01); *F21V 33/00* (2013.01); *F21V 33/0004* (2013.01); *G08B 5/36* (2013.01); *H01B 7/04* (2013.01); *H01R 13/7175* (2013.01); *H01R 24/64* (2013.01); *H05K 1/181* (2013.01); *F21W 2111/00* (2013.01); *F21Y 2115/10* (2016.08);

*G01P 13/00* (2013.01); *G01P 15/0802* (2013.01); *H01R 13/6658* (2013.01); *H01R 13/6683* (2013.01); *H01R 2107/00* (2013.01); *H05K 2201/10106* (2013.01)

(58) Field of Classification Search
CPC ............... F21V 23/003; F21V 23/0464; F21V 23/0492; F21V 33/00; F21V 33/0004; G08B 5/36; H01B 7/04
See application file for complete search history.

(56) References Cited

U.S. PATENT DOCUMENTS 7,748,860 B2 *   7/2010   Brunet .................. G01V 15/00
                                            362/249.08
8,620,123 B2 *   12/2013  Dean, Jr. ........... G02B 6/02033
                                            385/100

(Continued)

*Primary Examiner* — Sean Gramling
(74) *Attorney, Agent, or Firm* — Brake Hughes Bellermann LLP

(57) ABSTRACT

A cord assembly includes a first end including a Universal Serial Bus (USB) Type-C connector, a second end including a Universal Serial Bus (USB) Type-C connector, a flexible, electrically-conductive cord connecting the first and second ends, an LED light disposed at the first end, an accelerometer configured to generate a signal in response to a predetermined amount of movement of the accelerometer, and a controller coupled to the light and the accelerometer. The controller is configured to, when the second end is connected to a power source and when the first end is not connected to a device, in response to receipt of the signal generated by the accelerometer in response to movement of the accelerometer, control supply of power to the light to illuminate the light.

19 Claims, 4 Drawing Sheets

(51) Int. Cl.

| | | |
|---|---|---|
| *F21V 23/04* | (2006.01) | |
| *G08B 5/36* | (2006.01) | |
| *H01B 7/04* | (2006.01) | |
| *H01R 13/717* | (2006.01) | |
| *H01R 24/64* | (2011.01) | |
| *H05K 1/18* | (2006.01) | |
| *F21Y 115/10* | (2016.01) | |
| *F21W 111/00* | (2006.01) | |
| *G01P 13/00* | (2006.01) | |
| *G01P 15/08* | (2006.01) | |
| *H01R 107/00* | (2006.01) | |
| *H01R 13/66* | (2006.01) | |

(56) References Cited

U.S. PATENT DOCUMENTS

| | | | | |
|---|---|---|---|---|
| 8,796,939 | B1* | 8/2014 | Naumann | H05B 33/0857 |
| | | | | 315/200 A |
| 2015/0043875 | A1* | 2/2015 | Bookbinder | G02B 6/4482 |
| | | | | 385/100 |

* cited by examiner

POWER CABLE WITH MOTION-ACTIVATED LIGHT

CROSS-REFERENCE TO RELATED APPLICATIONS

This application is a non-provisional of, and claims priority to, U.S. Provisional Patent Application No. 62/208,088, filed on Aug. 21, 2015, entitled "POWER CABLE WITH MOTION-ACTIVATED LIGHT", the disclosure of which is incorporated by reference herein in their entirety.

TECHNICAL FIELD

This document relates to cables that carry power and, in particular, to power cables with motion-activated lights.

BACKGROUND

Many electronic devices rely on receiving power through a cord that can be plugged into the device. Mobile electronic devices are often disconnected from their power cord and then are plugged into the power cord to charge a battery in the mobile electronic device. A user may have many power cords used for various different devices in a particular location (e.g., on a desk or next to a bed), and the different cords often are difficult to distinguish, particularly in dim light and when the different cords are tangled are jumbled together, which can make it difficult to locate the proper cord that is needed to power a mobile electronic device within a group of different cords. In addition, in locations that are dimly lit it can be difficult to connect the plug of the power cord to the receptacle of the mobile electronic device.

SUMMARY

Power cords described herein overcome these disadvantages by providing a motion-activated light within the plug end of the power cord. With such an arrangement, when a user reaches into a tangle of multiple power cords and moves the cord including the motion-activated light, the light is turned on and allows the user to easily identify the cord that is lit up within the tangle of different cords. In addition, while the power cord with the motion-activated light is moved by the user, the light can remain on and can provide enough light to allow the user to easily locate the receptacle on the computing device and guide the plug into the receptacle.

In a general aspect, cord assembly includes a first end, a second end, a cord connecting the first and second ends, a light, and an accelerometer configured to generate a signal in response to a predetermined amount of movement of the accelerometer. In addition, the cord assembly includes a controller coupled to the light and accelerometer and configured to, when the second end is connected to a power source and when the first end is not connected to a device, in response to receipt of the signal generated by the accelerometer in response to movement of the accelerometer, control supply of power to the light to illuminate the light.

Implementations can include one or more of the following features, alone or in any combination with each other. For example, the controller can be configured to provide power to the light to illuminate the light for a predetermined amount of time when the second end is connected to a power source and when the first end is not connected to a device, in response to receipt of the signal generated by the accelerometer in response to movement of the accelerometer and, after the predetermined amount of time, to cease providing power to the light to illuminate the light.

The cord assembly can be configured to cease providing power to the light to illuminate the light in response to a signal from the accelerometer in response to a predetermined type of movement of the accelerometer. The controller can be programmable in response to one or more signals generated by the accelerometer in response to predetermined movements of the accelerometer to provide power to the light to turn the light on, or not to provide power to the light to turn the light on, when the second end is connected to a power source and when the first end is not connected to a device, in response to receipt of the signal generated by the accelerometer in response to movement of the accelerometer.

The controller can be programmable in response to one or more signals generated by a computing device into which the first or second end is plugged to provide power to the light to turn the light on, or not to provide power to the light to turn the light on, when the second end is connected to a power source and when the first end is not connected to a device, in response to receipt of the signal generated by the accelerometer in response to movement of the accelerometer. The first end can include a nose portion configured to mechanically couple the first end to a receptacle of a computing device, where the first end includes a printed circuit board (PCB), and where the light is mounted on an edge of the PCB proximate to an outer end of the first end and wherein the light from the light is directed along an axis of the nose portion.

The first end and the second end can be substantially identical in shape. The first end and the second end can include substantially identical electrical components. The cord assembly can conform to USB Type C standards.

The light can include an LED. The cord assembly also include a light sensor, and the controller can be configured to provide a variable amount of electrical power, which varies in response to an amount of light sensed by the light sensor, to the light to turn the light on when the second end is connected to a power source and when the first end is not connected to a device, in response to receipt of the signal generated by the accelerometer in response to movement of the accelerometer. The controller can be configured to control supply of power to the light to turn off the light, when the second end is connected to a power source and when the first end is connected to a device.

In another general aspect, a cord assembly includes a first end including a Universal Serial Bus (USB) Type-C connector, a second end including a Universal Serial Bus (USB) Type-C connector, a flexible, electrically-conductive cord connecting the first and second ends, an LED light disposed at the first end, an accelerometer configured to generate a signal in response to a predetermined amount of movement of the accelerometer, and a controller coupled to the light and the accelerometer. The controller is configured to, when the second end is connected to a power source and when the first end is not connected to a device, in response to receipt of the signal generated by the accelerometer in response to movement of the accelerometer, control supply of power to the light to illuminate the light.

Implementations can include one or more of the following features, alone or in any combination with each other. For example, the controller can be configured to provide power to the light to illuminate the light for a predetermined amount of time when the second end is connected to a power source and when the first end is not connected to a device, in response to receipt of the signal generated by the accelerometer in response to movement of the accelerometer and, after the predetermined amount of time, to cease providing power to the light to illuminate the light. The controller can be configured to cease providing power to the light to illuminate the light in response to a signal from the accelerometer in response to a predetermined type of movement of the accelerometer. The controller can be programmable in response to one or more signals generated by the accelerometer in response to predetermined movements of the accelerometer to provide power to the light to turn the light on, or not to provide power to the light to turn the light on, when the second end is connected to a power source and when the first end is not connected to a device, in response to receipt of the signal generated by the accelerometer in response to movement of the accelerometer. The controller can be programmable in response to one or more signals generated by a computing device into which the first or second end is plugged to provide power to the light to turn the light on, or not to provide power to the light to turn the light on, when the second end is connected to a power source and when the first end is not connected to a device, in response to receipt of the signal generated by the accelerometer in response to movement of the accelerometer.

The first end can include a nose portion configured to mechanically couple the first end to a receptacle of a computing device, where the first end includes a printed circuit board (PCB), and where the light is mounted on an edge of the PCB proximate to an outer end of the first end and where the light from the light is directed along an axis of the nose portion. The cord assembly can also include a light sensor, where the controller is configured to provide a variable amount of electrical power, which varies in response to an amount of light sensed by the light sensor, to the light to turn the light on when the second end is connected to a power source and when the first end is not connected to a device, in response to receipt of the signal generated by the accelerometer in response to movement of the accelerometer.

The details of one or more embodiments are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
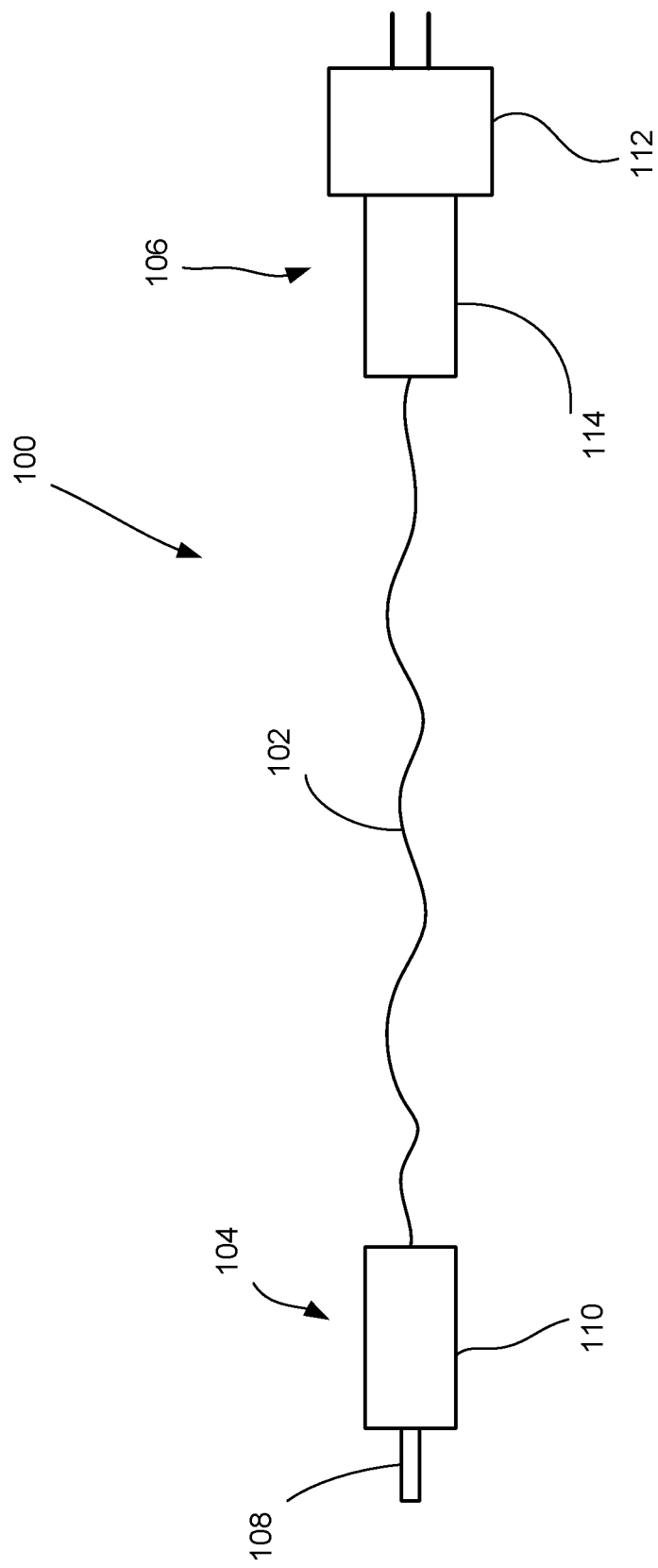
FIG. 1 is schematic diagram of a power cord assembly that includes a motion-activated light.

FIG. 1 is schematic diagram of a power cord assembly 100 that includes a motion-activated light. As shown in the FIG. 1, the cord assembly 100 can includes a flexible, electrically conductive section 102, a first end 104, and a second end 106. The cord 102 can be used, for example, to connect an electronic device to a power source. The first end 104 can include a nose portion 108 that can be inserted into a receptacle of a portable electronic device and an overmold portion 110. The nose portion 108 and/or the overmold portion 110 can include electrical components and circuitry for providing electrical power and data signals to the computing device. The first end 104 can include, for example, a first connector, including a connector housing.

The second end 106 can include a nose portion (not shown) that can be inserted into a receptacle of an electrical outlet or component that provides power. The second end 106 may include, for example, a second connector, including a second connector housing. For example, as shown in FIG. 1, the nose portion of the second end 106 can be inserted into a transformer 112 that can be plugged into a wall outlet that supplies AC power, where the transformer can convert AC power from the wall outlet into DC power that is supplied to the power cord assembly 100, so that the DC power can be provided an electronic device into which the first end 104 is plugged. The nose portion of the second end 106 also can be inserted into another electronic device (e.g., a desktop computer, a laptop computer, etc.) that can be configured to provide power through the cord assembly 100 to a mobile computing device that is attached to the cord assembly 100 at the nose 108 of the first end 104. The second end 106 also includes an overmold portion 114 that can include electrical components and circuitry for receiving electrical power and data signals that are provided to the through the cord assembly 100 to the computing device into which the first end 104 of the cord assembly 100 is plugged. In some implementations the first end 104 and the second end 106 are identical, so that the device the power cord assembly 102 can function the same, no matter which ends serve as the first and second ends.

In some implementations, the first end 104 and/or the second end 106 of the cord assembly 100 may include a connector that conforms to the Universal Serial Bus ("USB") 2.0 specifications that are published and maintained by the Universal Serial Bus Implementers Forum, Inc., and in some implementations, the first end 104 and/or the second end 106 of the cord assembly 100 may include a connector that conforms to the Universal Serial Bus Type-C (aka, Universal Serial Bus C or Universal Serial Bus 3.0) specifications that are published and maintained by the Universal Serial Bus Implementers Forum, Inc., with the shape of the circuitry of the noses and the overmold portions complying with the USB relevant standards. In some implementations, (e.g., when the cord assembly conforms the USB Type-C standards), the first end 104 and second end 106 of the cord assembly 100 can be identical, so that the cord assembly 100 can be "bi-directional," meaning that either end of the cord assembly 100 can be plugged into the power source, and either end of the cord assembly 100 can be plugged into the computing device that is to be charged.

Figure 2:
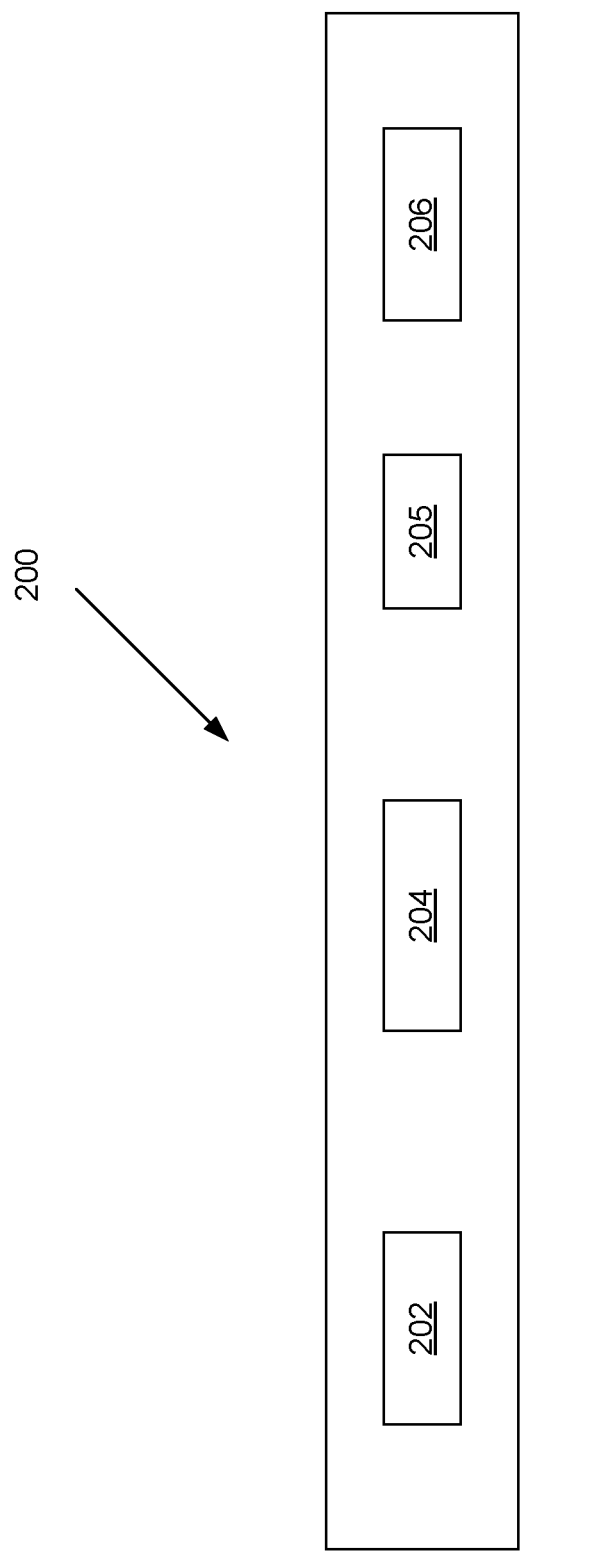
FIG. 2 is schematic diagram of a power cord assembly that includes a motion-activated light.

FIG. 2 is schematic diagram of a power cord assembly 200 that includes a motion-activated light. The power cord assembly 200 can correspond to the power cord assembly 100 of FIG. 1. As shown in FIG. 2, components of the cord assembly 200 can include a light (e.g., a light emitting diode (LED)) 202, an accelerometer 204, a light sensor 205, and a device controller 206. In some implementations, the light 202 can be located at an end of the cord assembly 200. In some implementations, the accelerometer 204, the light sensor 205, and the controller 206 also can be located at an end of the cord assembly 200, for example, in an overmold section at an end of the assembly. However, any of the components can be located anywhere within or on the cord assembly 200.

The controller 206 can include digital and/or analog circuitry that is configured for controlling the illumination of the light 202. The light 202, the accelerometer 204, and the controller 206 are coupled, or electrically connected or otherwise coupled, such that they function co-operatively.

When an end of the cord assembly 200 is plugged into a power source, power can be provided to the assembly 200, and the accelerometer 204 can generate a signal in response to the accelerometer 204 being moved. The signal from the accelerometer 204 can be supplied to the controller 206, and, in response to receipt of the signal, the controller 206 can cause power to be supplied to the light 202 to illuminate the light. In this manner, the light 202 can be turned on automatically in response to a user reaching for, and moving, the cord assembly 200, and then the cord assembly 200 can be easier to identify and grasp when the light 202 is illuminated.

The sensitivity of the accelerometer 204 and of the controller 206 can be adjusted or pre-determined to cause the light 202 to be illuminated in response to a movement that is determined to correspond to an intentional movement of the user of the cord assembly 200 but that is not so sensitive as to cause the light 202 to be illuminated in response a movement that is unlikely to correspond to an intentional movement of the user (e.g., a movement of the accelerometer 204 caused by vibration of a surface on which the cord assembly 200 rests). For example, the sensitivity can be defined by a time duration of threshold amount of detected acceleration exceeding a time threshold and/or a magnitude of detected acceleration exceeding a magnitude threshold.

In some implementations, the controller 206 can cause the light 202 to remain on for a predetermined period of time after the signal from the accelerometer 204 that causes the light 202 to be turned on is first received by the controller 206, and then the light 202 can be turned off automatically after expiration of the predetermined time period. In this implementation, the light 202 can be used as a visual signal for the user to locate the cord assembly 200 and then the light 202 can be turned off so as not to disturb the user after the user has identified the cord assembly 200.

In some implementations, the controller 206 can cause the light 202 to remain on continuously while the signal from the accelerometer 204 from the accelerometer 204 that causes the light 202 to be turned on is received by the controller 206. In this implementation, the light 202 can be used as a very small flashlight by a user while the user moves the cord, causing the accelerometer 204 to generate a signal that causes the light 202 to be turned on.

In some implementations, the controller 206 can cause the light 202 to remain on continuously while the signal from the accelerometer 204 is received by the controller 206 but can cause the light 202 to be turned off in response to a predetermined signal from the accelerometer 204. For example, the predetermined signal from the accelerometer 204 can correspond to a repeated shaking of the accelerometer 204 in a plane. In this manner, the user can use the light 202 as a mini flashlight but then can cause the light 202 to be turned off by shaking the accelerometer 204 up-and-down, or left and right, until the light 202 turns off.

In some implementations, the controller 206 can cause the light 202 to be turned off when an end of the assembly 200 is plugged into a computing device. For example, contact between an electrical contact within the nose of an end of the cord assembly 200 and a corresponding electrical contact within the computing device can generate a signal that is received by the controller 206 and that causes the controller 206 to turn off the light 202. For example, the contact within the computing device can open or close a switch, which generates a signal that is detected by the controller 206.

In some implementations, the light 202 can be positioned at an end of the cord assembly 200 so that it shines outward from the end of the cord assembly. In some implementations, when the end of the cord assembly includes an overbold portion, the material of the overmold portion of the end of the cord assembly can be at least partially transparent, and a light 202 position on a printed circuit board (PCB) within the overmold portion can shine through the transparent material of the overmold portion.

In some implementations, the light sensor 205 can sense an amount of ambient light in the vicinity of the cord assembly and can provide a signal to the controller 206 based on the sensed amount of light. In response to receiving this signal, the controller 206 can control the brightness of the light 202 that is turned on in response to the signal from the accelerometer. For example, the light 202 can be turned on at a low brightness level when the ambient light level is low and can be turned on at a high brightness level when the ambient light level is high.

In some implementations, the controller can be programmed in response to one or more signals generated by the accelerometer in response to predetermined movements of the accelerometer. This may allow a user to control, or program, the operation of motion-activated light in the cord assembly 200 through user-generated motion of the accelerometer 204. For example, the user may turn off the motion-activated light feature of the cord assembly 202 by tapping on the accelerometer a predetermined number of times in rapid succession, and the user may turn off the motion-activated light feature of the cord assembly 202 by waving the accelerometer back and forth a predetermined number of times in rapid succession.

In some implementations, the controller can be programmed in response to one or more data signals generated by a computing device into which the first or second end of the cord assembly is plugged. This may allow a user to control, or program, the operation of motion-activated light in the cord assembly 200, although this technique may be unavailable when the cord assembly is plugged in at one end to a power source and is unplugged at its other end.

Figure 3:
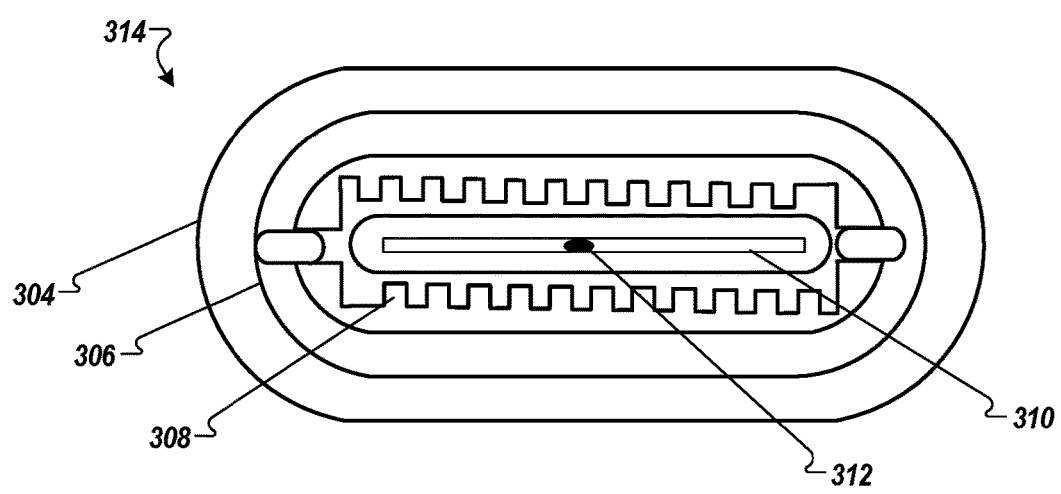
FIG. 3 is schematic diagram of a connector at an end of a power cord assembly that includes a motion-activated light.

FIG. 3 is schematic diagram of a connector 314 at an end of a power cord assembly that includes a motion-activated light. The connector 314 can be included on an end of a cable that can connect to, or interface with, a receptacle on a computing device (e.g., a phone, a table, a laptop computer, etc.). The connector 314 includes an overmold portion 304, and a nose portion 306 extending from overmold portion and that includes a plurality of electrical connectors 308. The electrical connectors 308 can be attached to a printed circuit board 310 that is located within the overmold portion 304 behind a recess in the nose portion 306 that is configured to receive electrical connectors from the receptacle of the computing device. The printed circuit board 310 may also include, or have mounted on it, the accelerometer and the device controller. The connector 314 can be symmetric about a midplane of the connector, so that the connector does not have "top" or "bottom" sides, but rather can be connected to a receptacle in the computing device in either of two equivalent orientations that have mirror-symmetry.

In some implementations, the light 312 can be mounted on an edge of the printed circuit board 310, so that the light can shine outward through the recess in the nose portion 306 along the axis of the nose portion. In some implementations, the light 312 can be embedded within the printed circuit board 310, such that emitted light can shine out through a recess in the printed circuit board through the recess in the nose portion. In some implementations, at least a portion of the printed circuit board can be made of transparent material, so that a light 312 bedded within the material of the printed circuit board can shine through the transparent material in a direction along an axis of the nose portion.

In some implementations (e.g., when the connector is a USB Type C connector), power generally may not be supplied to the connectors 308 or to components located on the printed circuit board 310 when at least one end of the cord assembly is not connected to a computing device. Because of this, in these implementation, for the controller 206 to provide power to illuminate the light 312, a mimic signal can be provided to the circuitry in the cord assembly, where the mimic signal indicates that both ends of the cord assembly are connected (e.g., one end to a computing device and one end to a power source or one end to a computing device and one end to a power source), even when one end actually is not connected. Then, when an accelerometer input is received by the controller 206 power can be provided to illuminate the light, even when one end or the cord assembly is not connected. In some implementations, the mimic can be provided in response to the signal from the accelerometer that would cause the light 312 to be turned on. In some implementations, the mimic can be provided whenever the cord assembly is connected to a power source.

In an implementation including the mimic signal, when the light 312 is illuminated and the end of the cord assembly that includes the light 312 is then connected to a computing device, it may be advantageous to turn off the mimic signal so that a signal indicating that both ends of the cord assembly are actually connected to a can be supplied to the controller of the cord assembly to cause power to be supplied by the cord assembly to the electrical connectors of at the end of the cord assembly. When this happens and the controller of the cord assembly that is responsible for providing power to the components of the assembly transitions from receiving the mimic signal to receiving the signal that both ends of the cord assembly are connected, a capacitor in the cord assembly may be used store charge to temporarily power components of the cord assembly. The capacitor can store enough charge to maintain power to the device controller, while transitioning from the mimic signal to the signal indicating that the computing device is actually connected.

Figure 4:
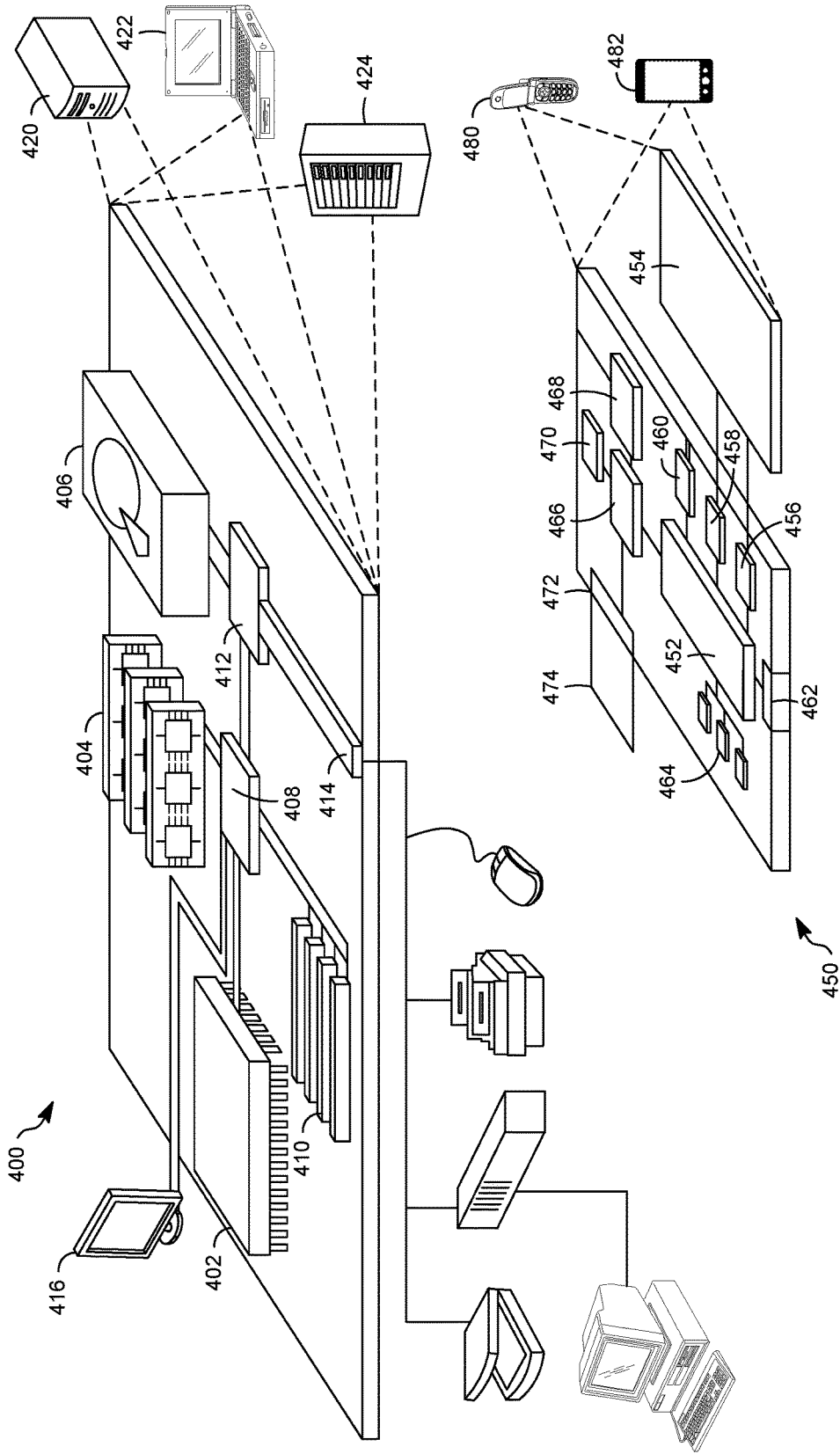
FIG. 4 is a schematic diagram of an example computing device and a mobile computing device, which may be used with the techniques described here.

FIG. 4 shows an example of a generic computing device 400 and a generic mobile computing device 450, which may be used with the techniques described here. Computing device 400 is intended to represent various forms of digital computers, such as laptops, desktops, workstations, personal digital assistants, servers, blade servers, mainframes, and other appropriate computers. Computing device 450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document. The power cord 100, 200 assembly can be plugged into the computing device 400, 450, either to provide power to, or receive power from, the computing device 400, 450.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. Each of the components 402, 404, 406, 408, 410, and 412, are interconnected using various busses, and may be mounted on a common motherboard or in other manners as appropriate. The processor 402 can process instructions for execution within the computing device 400, including instructions stored in the memory 404 or on the storage device 406 to display graphical information for a GUI on an external input/output device, such as display 416 coupled to high speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information within the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 404, the storage device 406, or memory on processor 402.

The high speed controller 408 manages bandwidth-intensive operations for the computing device 400, while the low speed controller 412 manages lower bandwidth-intensive operations. Such allocation of functions is exemplary only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a microdrive or other device, to provide additional storage. Each of the components 450, 452, 464, 454, 466, and 468, are interconnected using various buses, and several of the components may be mounted on a common motherboard or in other manners as appropriate.

The processor 452 can execute instructions within the computing device 450, including instructions stored in the memory 464. The processor may be implemented as a chipset of chips that include separate and multiple analog and digital processors. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT LCD (Thin-Film-Transistor Liquid Crystal Display) or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provide in communication with processor 452, so as to enable near area communication of device 450 with other devices. External interface 462 may provide, for example, for wired communication in some implementations, or for wireless communication in other implementations, and multiple interfaces may also be used.

The memory 464 stores information within the computing device 450. The memory 464 can be implemented as one or more of a computer-readable medium or media, a volatile memory unit or units, or a non-volatile memory unit or units. Expansion memory 474 may also be provided and connected to device 450 through expansion interface 472, which may include, for example, a SIMM (Single In Line Memory Module) card interface. Such expansion memory 474 may provide extra storage space for device 450, or may also store applications or other information for device 450. Specifically, expansion memory 474 may include instructions to carry out or supplement the processes described above, and may include secure information also. Thus, for example, expansion memory 474 may be provide as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 474, or memory on processor 452, that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MIMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, WiFi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smart phone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

What is claimed is:

1. A cord assembly comprising:
    a first end;
    a second end;
    a cord connecting the first and second ends;
    a light;
    an accelerometer configured to generate a signal in response to a predetermined amount of movement of the accelerometer; and
    a controller coupled to the light and accelerometer, the controller configured to, when the second end is connected to a power source and when the first end is not connected to a device, in response to receipt of the signal generated by the accelerometer in response to movement of the accelerometer, control supply of power to the light to illuminate the light.

2. The cord assembly of claim 1, wherein the cord assembly conforms to USB Type C standards.

3. The cord assembly of claim 1, wherein the light includes an LED.

4. The cord assembly of claim 1, wherein the controller is configured to provide power to the light to illuminate the light for a predetermined amount of time when the second end is connected to a power source and when the first end is not connected to a device, in response to receipt of the signal generated by the accelerometer in response to movement of the accelerometer and, after the predetermined amount of time, to cease providing power to the light to illuminate the light.

5. The cord assembly of claim 1, wherein the controller is configured to cease providing power to the light to illuminate the light in response to a signal from the accelerometer in response to a predetermined type of movement of the accelerometer.

6. The cord assembly of claim 1, wherein the controller is programmable in response to one or more signals generated by the accelerometer in response to predetermined movements of the accelerometer to provide power to the light to turn the light on, or not to provide power to the light to turn the light on, when the second end is connected to a power source and when the first end is not connected to a device, in response to receipt of the signal generated by the accelerometer in response to movement of the accelerometer.

7. The cord assembly of claim 1, wherein the controller is programmable in response to one or more signals generated by a computing device into which the first or second end is plugged to provide power to the light to turn the light on, or not to provide power to the light to turn the light on, when the second end is connected to a power source and when the first end is not connected to a device, in response to receipt of the signal generated by the accelerometer in response to movement of the accelerometer.

8. The cord assembly of claim 1,
    wherein first end includes a nose portion configured to mechanically couple the first end to a receptacle of a computing device,
    wherein the first end includes a printed circuit board (PCB), and
    wherein the light is mounted on an edge of the PCB proximate to an outer end of the first end and wherein the light from the light is directed along an axis of the nose portion.

9. The cord assembly of claim 1,
    wherein the first end and the second end are substantially identical in shape.

10. The cord assembly of claim 1,
    wherein the first end and the second end include substantially identical electrical components.

11. The cord assembly of claim 1, further comprising:
    a light sensor,
    wherein the controller is configured to provide a variable amount of electrical power, which varies in response to an amount of light sensed by the light sensor, to the light to turn the light on when the second end is connected to a power source and when the first end is not connected to a device, in response to receipt of the signal generated by the accelerometer in response to movement of the accelerometer.

12. The cord assembly of claim 1, wherein the controller is configured to control supply of power to the light to turn off the light, when the second end is connected to a power source and when the first end is connected to a device.

13. A cord assembly comprising:
    a first end including a Universal Serial Bus (USB) Type-C connector;
    a second end including a Universal Serial Bus (USB) Type-C connector;
    a flexible, electrically-conductive cord connecting the first and second ends;
    an LED light disposed at the first end;
    an accelerometer configured to generate a signal in response to a predetermined amount of movement of the accelerometer; and
    a controller coupled to the light and the accelerometer, the controller configured to, when the second end is connected to a power source and when the first end is not connected to a device, in response to receipt of the signal generated by the accelerometer in response to movement of the accelerometer, control supply of power to the light to illuminate the light.

14. The cord assembly of claim 13, wherein the controller is configured to provide power to the light to illuminate the light for a predetermined amount of time when the second end is connected to the power source and when the first end is not connected to a device, in response to receipt of the signal generated by the accelerometer in response to movement of the accelerometer and, after the predetermined amount of time, to cease providing power to the light to illuminate the light.

15. The cord assembly of claim 13, wherein the controller is configured to cease providing power to the light to illuminate the light in response to a signal from the accelerometer in response to a predetermined type of movement of the accelerometer.

16. The cord assembly of claim 13, wherein the controller is programmable in response to one or more signals generated by the accelerometer in response to predetermined movements of the accelerometer to provide power to the light to turn the light on, or not to provide power to the light to turn the light on, when the second end is connected to a power source and when the first end is not connected to a device, in response to receipt of the signal generated by the accelerometer in response to movement of the accelerometer.

17. The cord assembly of claim 13, wherein the controller is programmable in response to one or more signals generated by a computing device into which the first or second end is plugged to provide power to the light to turn the light on, or not to provide power to the light to turn the light on, when the second end is connected to a power source and when the first end is not connected to a device, in response to receipt of the signal generated by the accelerometer in response to movement of the accelerometer.

18. The cord assembly of claim 13,
wherein first end includes a nose portion configured to mechanically couple the first end to a receptacle of a computing device,
wherein the first end includes a printed circuit board (PCB), and
wherein the light is mounted on an edge of the PCB proximate to an outer end of the first end and wherein the light from the light is directed along an axis of the nose portion.

19. The cord assembly of claim 13, further comprising:
a light sensor,
wherein the controller is configured to provide a variable amount of electrical power, which varies in response to an amount of light sensed by the light sensor, to the light to turn the light on when the second end is connected to a power source and when the first end is not connected to a device, in response to receipt of the signal generated by the accelerometer in response to movement of the accelerometer.

* * * * *